United States Patent
Predtechensky

(10) Patent No.: US 6,846,467 B1
(45) Date of Patent: Jan. 25, 2005

(54) PLASMA-CHEMICAL REACTOR

(76) Inventor: Mikhail Rudolfovich Predtechensky, Russian Federation, Novosibirsk, Morskoi pr., 40, kv. 38 (RU)

( * ) Notice: Subject to any disclaimer, the term of this patent is extended or adjusted under 35 U.S.C. 154(b) by 216 days.

(21) Appl. No.: 10/069,648

(22) PCT Filed: Jun. 27, 2000

(86) PCT No.: PCT/RU00/00257

§ 371 (c)(1),
(2), (4) Date: May 23, 2002

(87) PCT Pub. No.: WO02/01927

PCT Pub. Date: Jan. 3, 2002

(51) Int. Cl.[7] ................................................ B01J 19/08
(52) U.S. Cl. ................................................ 422/186.21
(58) Field of Search .................................... 422/186.21

(56) References Cited

U.S. PATENT DOCUMENTS

| | | | |
|---|---|---|---|
| 3,614,489 A | * 10/1971 | Jensen et al. | 310/11 |
| 3,622,493 A | 11/1971 | Crusco | 204/323 |
| 3,658,673 A | 4/1972 | Kugler et al. | 204/164 |
| 3,840,750 A | 10/1974 | Davis et al. | 250/547 |
| 5,206,879 A | 4/1993 | Moody et al. | 373/22 |
| 6,265,690 B1 * | 7/2001 | Fornsel et al. | 219/121.5 |

FOREIGN PATENT DOCUMENTS

| | | | |
|---|---|---|---|
| RU | 1620032 | 11/1995 | H05B/7/22 |
| RU | 2074130 | 2/1997 | C03B/5/00 |

* cited by examiner

Primary Examiner—Steven Versteeg
(74) Attorney, Agent, or Firm—Ostrolenk, Faber, Gerb & Soffen, LLP

(57) ABSTRACT

The reactor contains the reaction chamber (1), the means for the removal of aim product from the reaction chamber (7), at least a pair of electrodes in the reaction chamber, each made as an open container (2) filled with metal (3), placed in such a way that voltage applied between them strikes an arc discharge in the space between electrodes, and the means for supplying the reaction chamber with plasma forming gas which feeds the reaction chamber with plasma forming gas to form the vortex flow of the gas in the space between the electrodes.

12 Claims, 1 Drawing Sheet

PLASMA-CHEMICAL REACTOR

FIELD OF ART

The invention relates to chemical reactors employing electric discharge plasma as the source of high temperature. This reactor can be used in chemical engineering, metallurgy and other industries for the production of such chemical products as gas synthesis, hydrocarbons etc., as well as in environment control, health protection, biosphere preservation as an effective device for the decomposition of depleted persistent toxic agents and their removal from industrial exhaust and waste.

STATE OF THE ART

Plasma chemical reactors are well known. Their main element is a discharge chamber provided with two electrodes and with an inlet and outlet for plasma forming gas. Thus there are plasma chemical reactors employing some inert gas such as nitrogen, argon or hydrogen as a plasma forming gas. Plasma is formed in the reactor by exciting the is plasma forming gas with an electric discharge in a specially equipped chamber and then fed to the separate reaction chamber with the reaction mixture where the plasma induces chemical reactions yielding the desired target product.

Among such reactors we can name, for instances, the device for high-temperature chemical reactions yielding powders of high-purity metals of IVb, Vb, VIb groups of the periodical table, i.e. titanium, tungsten, molybdenum etc., or their alloys as well as for the halogenation of metal oxides and the synthesis of hydrocarbons such as acetylene, gasoline etc. The device is equipped with a plasma generator producing plasma by means of an electrical discharge between the anode and cathode when plasma forming gas such as argon or nitrogen is fed there. The plasma from the generator and gaseous reaction mixture are fed to a special reaction zone in the device below the anode. A chemical reaction proceeding afterwards in the reaction zone yields the desired product. After the reaction the flow of the reaction mixture containing the desired product is quenched in the quenching zone and separated into several flows later combined in a collector zone where the pure target product is extracted (U.S. Pat. No. 3,840,750).

One of the well-known devices is also a plasma reactor for the thermal cracking of substances, mainly hydrocarbons. The plasma is generated in a discharge chamber specially equipped with axially fixed anode and cathode between which an electrical arc is formed, through which a plasma forming gas—hydrogen or nitrogen—is passed. The discharge chamber is connected with a mixing chamber where all the necessary reagents forming the initial hydrocarbon reaction mixture of preset composition are fed. Then the initial reaction mixture heated to several thousands degrees Celsius is introduced directly into the reaction chamber where the desired product is formed. The target product is isolated via subsequent rapid cooling of the reaction mixture by cold quenching gas in the free space over the reaction chamber. Then the final product is fed to the scrubber to wash the gas off (U.S. Pat. No. 3,622,493). The above-described plasma chemical reactors are bulky, have cornplicatcd design and are expensive. In addition the service life of electrodes in the discharge chamber is rather short because of the erosion caused by high voltage, strong currents and plasma particle bombardment of the surface which necessitates their frequent replacing requiring too many shutdowns of the reactors.

Some plasma chemical reactors are known where the reaction gas serves directly as the plasma forming gas. Their design is much simpler than that of those described above because they have a single reaction chamber equipped with a pair of electrodes through which the reaction gas is passed between them under the application of high voltage striking an electric arc discharge. Among the plasma chemical reactors of the similar design are, for instance, the reactor whose reaction chamber is equipped with an anode and cathode to which high voltage is applied, as well as with inlet and outlet devices for reagent inlet and the outlet of the target product (U.S. Pat. No. 3658673). The reaction mixture is passed between the electrodes and set into forward-rotawy motion leading to the formation of vortex stabilizing the plasma arc between electrodes. In this reactor the electrodes in addition to the above-mentioned factors are exposed to the aggressive chemical medium, their surface is soon eroded and unusable and are to be replaced frequently (every several hours). The electrodes erosion increases with the increasing in the electrical discharge current thus limiting the maximum current value and imposing restriction on the maximum productivity of plasma chemical reactor.

There is also a plasma chemical reactor for the thermal decomposition of chemical industrial waste. The reactor consists of the reaction chamber with two electrodes between which the treated gas mixed with the oxygen at the voltage of 100–3000 V causing current of 50–1000 A (U.S. Pat. No. 5,206,879). This reactor, as well as above-mentioned ones, requires frequent (every several hours) electrodes replacement, because the presence of oxygen significantly accelerates the erosion of the electrodes. All this also imposes constraints on its productivity.

DISCLOSURE OF THE INVENTION

The object of the present invention is the sufficient prolongation of the plasma chemical reactor electrodes service life with corresponding decreasing of the expenses of its exploitation and increasing of the reactor productivity.

This is attained by the suggested design of a plasma chemical reactor consisting of reaction chamber, means for supplying the plasma forming gas and the means for removal gf the aim product, at least a pair of electrodes placed in the reaction chamber, so as to provide a gas arc formation in the electrode gap on the application of the electric voltage. Each electrode is shaped as an open container filled with metal and the means for supplying the reaction chamber with plasma forming gas to be fed to the electrode gap as a vortex.

The electrodes in the reaction chamber should be arranged horizontally, because the electrical arc initially emerging between solid electrodes gradually melts them and in the course of long-time operation the electrodes become liquid. For example, each container can be made as a tank at the bottom of the chamber, with the setting from the refractory material with dielectric properties, i.e. ladle brick. The container is filled with metal pieces, particles or ordinary scrap metal. To maintain the arc discharge at voltage supply to the electrodes, the ratio of such technological parameters as voltage value, the distance between electrodes, the consumption of plasma forming gas fed to the chamber, its composition, etc, specified for each construction separately, is important.

The melting of the metal in the containers because of the electrical arc leads to the liquefaction of the electrodes working surfaces (the surfaces, between which an electrical arc burns) during the reactor operation, so the electrode is not subject to erosion in the broad sense, but rather to the slow evaporation of the metal and the decrease in its mass. Due to the big mass of the electrode, the reactor can operate for a long time without stops depending on the volume of electrode container and the velocity of the metal evaporation.

To additionally increase the period of continuous operation of the reactor, it is necessary to provide every container with a metal supply means. Those can have the shape of chutes going to containers, along which metal pieces are fed.

The voltage is supplied to the electrodes directly through the metal filling the containers. For this purpose every container is provided with special means for voltage supply to the filling metal, which may be designed as a channel with a metal conductor inside, one end of which is connected with the container, melts together with the filling metal, and the other end, connected with the contacts for the electrical voltage supply, remains solid. Hearth water-cooled electrode may also be used for the same purpose.

The means for the supply of plasma forming gas to the reaction chamber between electrodes can have different constructions. It is important for the means to form a vortex gas flow stabilizing the electric arc and precluding the contact between the electrical arc and chamber parts. One of acceptable and simple designs of this means includes the wall made of refractory dielectric material. Its size can be different, but height and width must prevent the arc discharge established at voltage supply to electrodes from bending around this wall. The wall may be made as a partition between the bottom and ceiling of the reaction chamber, dividing its volume in two parts, if it is technically feasible. There is a discharge channel directing the arc discharge in the wall. It may be made as a central through cylindrical hole or as a tube fixed in such a hole and bent in such a way that its ends were directed towards the surface of electrodes. Gas channels connected with the discharge channel and a plasma forming gas source through which the plasma forming gas is injected directly to inter-electrode space. The electric arc is formed in the discharge channel on the wall and enters the reaction chamber volume between electrodes on the both sides of this wall.

In order to stabilize the arc discharge, the plasma forming gas is set into rotation with vortex formation. The resulting vortex must form a cooler and therefore denser plasma forming gas layer between the electric arc and the discharge channel wall which insulates the chamber walls and its other parts. For this purpose gas channels are placed at an angle to the surface of the discharge channel they are connected with, i.e. the gas is introduced tangentially. The plasma forming gas enters the discharge channel at an angle to its wall and then forms a vortex.

If the discharge channel is not sufficient for the vortex formation, the means for the supply of plasma forming gas to the reaction chamber can be additionally equipped with a vortex chamber of a well-known design. For example, it can be shaped as a cylindrical groove inside the channel wall of means reaction gas supplying, which is connected with the discharge channel and has bigger diameter than that of the channel, and the gas channels are brought out to its walls at an angle. The successive arrangement of several vortex chambers in the discharge channel is also possible. In this case plasma forming gas passes through every chamber and it can be of one composition and fed through all the channels from the same source or it composition may differ and multiple sources of plasma forming gas can be used.

The walls of discharge channel can be cooled by water to prevent their destruction by high temperatures.

The reaction chamber volume must be much larger than the above-mentioned device to serving as the plasma source for sustaining plasma chemical reactions. The plasma forming gas is heated to high temperature in the discharge channel and is passed into the reaction chamber volume where it is combined with other reagents or the reaction mixture and induces the further chemical reaction.

There are different ways of conducting chemical reactions in the reactor. Thus, plasma forming gas feeds through a special means can be an inert gas such as argon, nitrogen, etc., or reaction mixture specially prepared outside the chamber, or individual reagents involved in the aim reaction. When a plasma forming inert gas or individual reagents are used the reaction chamber must be equipped with special conduits for dispensing the prescribed quantities of the reaction mixture made outside the chamber or all the necessary reagents (liquid, solid, gaseous). If the plasma forming gas is reaction mixture, additional device for supplying the specific gas or individual reactants can be provided, if necessary.

For the aim product output from the reaction chamber it is equipped with the means for its removal.

To fire an electrical arc and to start the operation of the reactor the well-known methods are used:

1. Electrodes are linked through the discharge channel by a wire connector. Plasma forming gas is passed to the chamber through gas channels, and electrical current is applied to the electrodes. The wire connector instantly becomes hot and explodes generating a plasma channel striking an arc discharge.

2. Metal plates—electrode links—are installed into the discharge channel walls. The plasma forming gas is fed through the gas channels and simultaneously the voltage is applied to the electrodes. Further, high-voltage pulse is sent to the electrode links, resulting in the plasma forming gas break-down, which in its turn initiates the formation of arc discharge.

The required reactions take place in the reaction chamber under high temperatures of arc discharge and electric arc effects the melting of electrode metal filling the containers, which are eventually filled with melted metal.

Since waste accumulation in electrode containers is possible in the course of the reactor operation, waste removal devices can prove useful, e.g. every container could be equipped with a siphon.

BEST MODES CARRYING-OUT THE INVENTION

Figure 1:
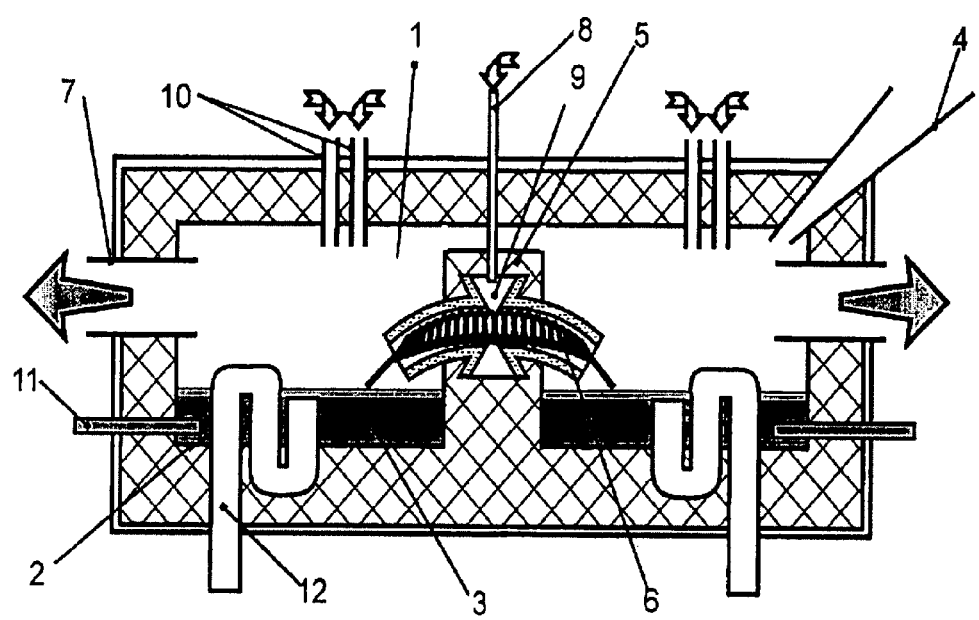
FIG. 1 shows the scheme of the reaction chamber of the plasma chemical reactor where:
(1)—reaction chamber, (2)—electrode container, (3)—metal filling the electrode container, (4)—chute for providing electrode container with metal, (5)—a wall in the electrode gap, (6)—discharge channel, (7)—aim product outlet, (8)—gas channels for plasma forming gas, (9)—vortex chamber, (10)—additional inlets for reaction gas and reagents, (11)—device for voltage supply to electrode container, (12)—device for slag removal.

By way of example of plasma chemical reaction operation synthesis-gas production process can be considered. The reactor contains a large volume reaction chamber (1) with two refractory lining tanks (2), filled with scrap iron (3), at the bottom. Each tank has a special channel with a connector for electrical voltage supply directly to the scrap metal in the tank (11). Vertical wall of the refractory brick (5), fixed at the bottom of the chamber (the wall is not connected with the ceiling of the chamber) is placed between the tanks. This wall has such a height and width that arc discharge is unable to bend around it when the voltage is applied to the electrodes. There is a tube-like discharge channel (6), bent in such a way that its ends (and outlets accordingly) were directed to the surface of the electrodes in the wall. The vortex chamber is shaped as an additional groove in the discharge channel with the diameter lager than that of the channel itself. There are also gas channels (8) for plasma forming gas, one end of which is connected with the source of this gas, and the other end tangentially entering the vortex chamber (9). The length of the discharge channel must be sufficient for the plasma forming gas entering through gas channels to form a vortex, able to stabilize the electric arc. The reactor is started up by the initiation of electrical breakdown by a high-voltage electrical pulse. Further, reagents—hydrocarbons and water steam—are fed to the chamber volume through a special conduit in the ceiling of the chamber (10). Plasma is a source of high temperature necessary for chemical reaction to proceed. Small quantities of iron vapors coming from the molten electrode surface are the catalyst of the reaction yielding synthesis as increasing the reaction rate. The target product i.e. the synthesis gas is withdrawn from the reaction chamber through two outlets in the opposite walls (7). Coal, natural gas or other hydrocarbons, instead of vapor, or oxygen-vapor mixture can be put into the reaction chamber. Inert gas, water steam, natural gas or other suitable substances can be used as plasma forming gas. To additionally increase the productivity of the plasma chemical reactor it is possible to increase the volume of its reaction chamber. The chutes (4) serve to fill the electrode containers with metal. There are siphons (12) for slag removal from the electrode surface.

When used for other chemical processes the reactor can be customized and further developed.

In the present plasma chemical reactor the service life of the electrodes is fairly long because they have big mass and their surface during the reactor operation is in molten state. The liquid surface of the electrodes is not prone to erosion, so no shutdown of the reactor for the electrode replacement will be necessary.

INDUSTRIAL APPLICABILITY

Plasma chemical reaction may be applied in metallurgy, chemical and other industries for the production of chemical products and in environment protection for treating noxious production waste.

What is claimed is:

1. A plasma chemical reactor comprising:
   a reaction chamber;
   gas supply means for supplying the reaction chamber with plasma forming gas;
   means for the removal of the aim product from the reaction chamber; and
   at least a pair of electrodes in the reaction chamber,
      each electrode being located in an open container filled with metal, and
      disposed in such a way that voltage applied between them strikes an arc discharge in the space between the electrodes; and
   wherein the gas supply means feeds the plasma forming gas to the reaction chamber between the electrodes to form a vortex flow of the gas in the space between the electrodes.

2. The plasma chemical reactor according to claim 1, wherein the arc discharge in the space between the electrodes is such that it induces melting of the metal within the open containers.

3. The plasma chemical reactor according to claim 1, wherein the electrodes in the reaction chamber are arranged horizontally.

4. The plasma chemical reactor according to claim 1, wherein the reaction chamber includes additional inlets for individual reagents and reaction mixture.

5. The plasma chemical reactor according to claim 1, wherein the electrode containers and the gas supply means are formed of a heat-resistant dielectric material.

6. The plasma chemical reactor according to claim 1 further including a chute communicating with each electrode container, the chutes being constructed and arranged for filling the associated container with metal.

7. The plasma chemical reactor according to claim 1, further including voltage supply means for applying voltage to metal within each electrode container, the voltage supply means each being comprised of a channel within which an electrical conductor is received, the conductor having a first end which is brought in contact with the metal filling the container and which melts together with the metal, and the second end which is connected to an external voltage source, and which remains solid during operation.

8. The plasma chemical reactor according to claim 1, wherein the gas supplymeans is comprised of:
   a vertical wall at the bottom of the chamber;
   a discharge channel;
   a plurality of internal gas channels,
   the gas channels having respective outlet ends communicating with the discharge channel and
      respective inlet ends communicating with at least one source of plasma forming gas; the gas channels being located at an angle to the wall of the discharge channel such that plasma forming gas forms the vortex in the discharge channel.

9. The plasma chemical reactor according to claim 8, wherein the discharge channel is comprised of a cylindrical hole through the wall of the gas supply means.

10. The plasma chemical reactor according to claim 8, wherein the discharge channel is comprised of a tubular member located in the vertical wall of the gas supply means, the tubular member being bent in such a way that its ends are directed towards the electrode surface.

11. The plasma chemical reactor according to claim 8, wherein the discharge channel includes at least with one vortex chamber.

12. The plasma chemical reactor according to claim 11, wherein:
   the vortex chamber is comprised of a cylindrical groove coaxial with, and of larger diameter than the diameter of the discharge channel; and
   the gas channels are oriented at an angle to the side walls of the vortex chamber such that the vortex flow of the gas is produced.

* * * * *